United States Patent
Lai et al.

(10) Patent No.: US 9,620,201 B1
(45) Date of Patent: Apr. 11, 2017

(54) STORAGE SYSTEM AND METHOD FOR USING HYBRID BLOCKS WITH SUB-BLOCK ERASE OPERATIONS

(71) Applicant: SanDisk Technologies Inc., Plano, TN (US)

(72) Inventors: Joanna Lai, San Jose, CA (US); Nian Niles Yang, Mountain View, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/138,984

(22) Filed: Apr. 26, 2016

(51) Int. Cl.
  *G11C 16/04* (2006.01)
  *G11C 16/16* (2006.01)
  *G11C 11/56* (2006.01)
  *G11C 16/10* (2006.01)

(52) U.S. Cl.
  CPC ...... *G11C 11/5635* (2013.01); *G11C 11/5628* (2013.01); *G11C 16/10* (2013.01); *G11C 16/16* (2013.01); *G11C 2211/5641* (2013.01)

(58) Field of Classification Search
  CPC ............ G11C 16/10; G11C 2211/5641; G11C 11/5635; G11C 16/16
  USPC ....................................... 365/185.09, 185.11
  See application file for complete search history.

(56) References Cited

U.S. PATENT DOCUMENTS

| | | | |
|---|---|---|---|
| 2008/0126686 A1* | 5/2008 | Sokolov ................ | G06F 1/3203 711/103 |
| 2008/0316816 A1* | 12/2008 | Lin ...................... | G11C 11/5628 365/185.03 |
| 2016/0070643 A1* | 3/2016 | Shen ................... | G06F 12/0246 711/103 |
| 2016/0147482 A1* | 5/2016 | Jang ..................... | G06F 3/0679 711/103 |
| 2016/0210083 A1* | 7/2016 | Oh ........................ | G06F 3/0652 |

* cited by examiner

*Primary Examiner* — Ly D Pham
(74) *Attorney, Agent, or Firm* — Brinks Gilson & Lione

(57) ABSTRACT

A storage system and method for using hybrid blocks with sub-block erase operations are provided. In one embodiment, a storage system is provided comprising a memory comprising a block, wherein the block comprises a first sub-block and a second sub-block; and a controller in communication with the memory. The controller is configured to erase the first sub-block, wherein the second sub-block is programmed; and program the first sub-block to fewer bits per cell than the second sub-block is programmed to. Other embodiments are provided.

22 Claims, 8 Drawing Sheets

STORAGE SYSTEM AND METHOD FOR USING HYBRID BLOCKS WITH SUB-BLOCK ERASE OPERATIONS

BACKGROUND

Some storage systems contain a memory that is organized into a plurality of memory blocks. Data can be written into part of a block; however, to erase data from part of a block, the entire block is typically erased. In such an operation, data from the block that needs to be preserved is relocated to another block, and then the entire block is erased. The erased block can then be used as a fresh block to store data.

DETAILED DESCRIPTION

Overview

Figure 1A:
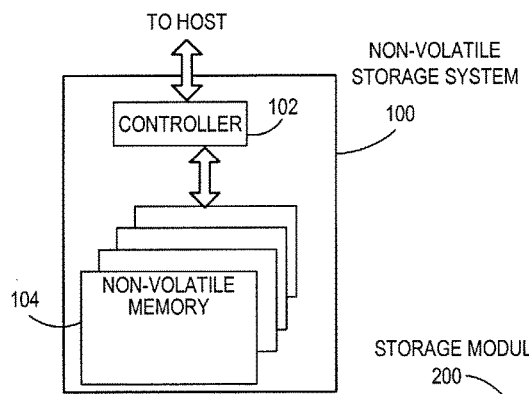
FIG. 1A is a block diagram of a non-volatile storage system of an embodiment.

By way of introduction, the below embodiments relate to a storage system and method for using hybrid blocks with sub-block erase operations. In one embodiment, a storage system is provided comprising a memory comprising a block, wherein the block comprises a first sub-block and a second sub-block; and a controller in communication with the memory. The controller is configured to erase the first sub-block, wherein the second sub-block is programmed; and program the first sub-block to fewer bits per cell than the second sub-block is programmed to.

In some embodiments, the memory comprises a three-dimensional memory.

In some embodiments, the controller is further configured to move data programmed in the first sub-block to a block having more bits per cell than the first sub-block.

In some embodiments, the first sub-block is programmed using a single level cell (SLC) mode, and wherein the second sub-block is programmed using a multi-level cell (MLC) mode.

In some embodiments, the block comprises at least one additional sub-block.

In some embodiments, the first and second sub-blocks are the same size.

In some embodiments, the first and second sub-blocks are different sizes.

In some embodiments, the block comprises a plurality of word lines, and wherein a programming order of the word lines starts with the word lines in the first sub-block.

In some embodiments, the storage system is embedded in a host.

In some embodiments, the storage system is removably connected to a host.

In another embodiment, a method is provided that is performed in a storage system comprising a memory comprising a block. The method comprises erasing a first portion of the block while leaving a second portion of the block with data written in it; and writing data in the first portion of the block using a write mode that is characterized by a lower bit error rate than a write mode used to write data in the second portion of the block.

In some embodiments, the memory comprises a three-dimensional memory.

In some embodiments, the method further comprises moving data programmed in the first portion to a block having more bits per cell than the first portion.

In some embodiments, the first portion is programmed using a single level cell (SLC) mode, and wherein the second portion is programmed using a multi-level cell (MLC) mode.

In some embodiments, the block comprises at least one additional portion.

In some embodiments, the first and second portions are the same size.

In some embodiments, the first and second portions are different sizes.

In some embodiments, the block comprises a plurality of word lines, and wherein a programming order of the word lines starts with the word lines in the first portion.

In some embodiments, the storage system is embedded in a host.

In some embodiments, the storage system is removably connected to a host.

In another embodiments, a storage system is provided comprising a memory comprising a block, wherein the block comprises a first sub-block and a second sub-block; means for erasing the first sub-block, wherein the second sub-block is programmed; and means for programming the first sub-block to fewer bits per cell than the second sub-block is programmed to.

In some embodiments, the memory comprises a three-dimensional memory.

In some embodiments, the storage system is embedded in a host.

In some embodiments, the storage system is removably connected to a host.

Other embodiments are possible, and each of the embodiments can be used alone or together in combination. Accordingly, various embodiments will now be described with reference to the attached drawings.

Exemplary Embodiments

Figure 1B:
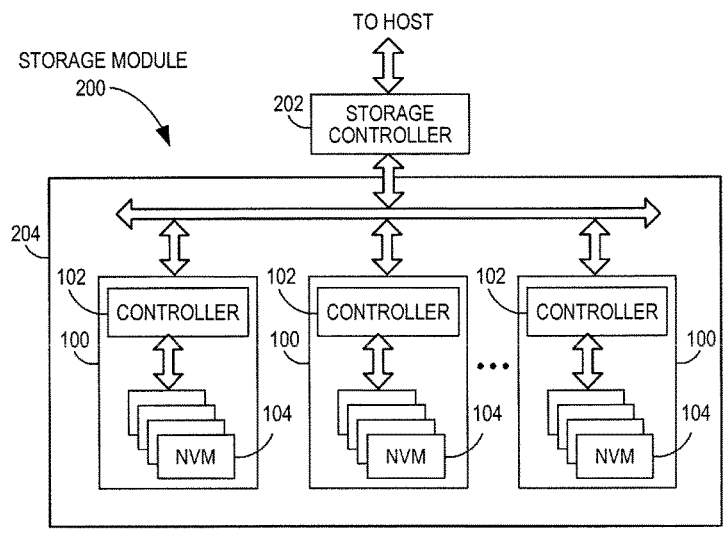
FIG. 1B is a block diagram illustrating an exemplary storage module of an embodiment.
Figure 1C:
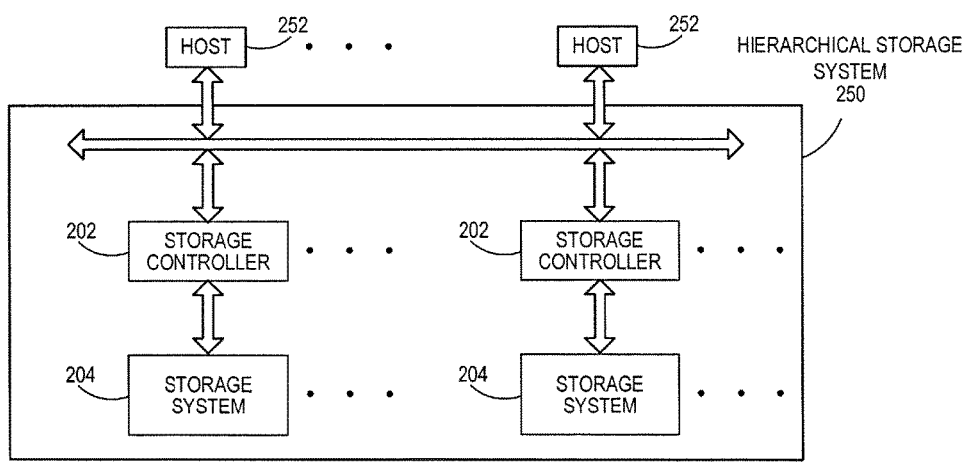
FIG. 1C is a block diagram illustrating a hierarchical storage system of an embodiment.

Storage systems suitable for use in implementing aspects of these embodiments are shown in FIGS. 1A-1C. FIG. 1A is a block diagram illustrating a non-volatile storage system 100 according to an embodiment of the subject matter described herein. Referring to FIG. 1A, non-volatile storage system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a flash memory controller) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address.) The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, storage system 100 may be a card based system, such as a secure digital (SD) or a micro secure digital (micro-SD) card. In an alternate embodiment, storage system 100 may be part of an embedded storage system.

Although, in the example illustrated in FIG. 1A, non-volatile storage system 100 (sometimes referred to herein as a storage module) includes a single channel between controller 102 and non-volatile memory die 104, the subject matter described herein is not limited to having a single memory channel. For example, in some NAND storage system architectures (such as the ones shown in FIGS. 1B and 1C), 2, 4, 8 or more NAND channels may exist between the controller and the NAND memory device, depending on controller capabilities. In any of the embodiments described herein, more than a single channel may exist between the controller and the memory die, even if a single channel is shown in the drawings.

FIG. 1B illustrates a storage module 200 that includes plural non-volatile storage systems 100. As such, storage module 200 may include a storage controller 202 that interfaces with a host and with storage system 204, which includes a plurality of non-volatile storage systems 100. The interface between storage controller 202 and non-volatile storage systems 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be an NVMe or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
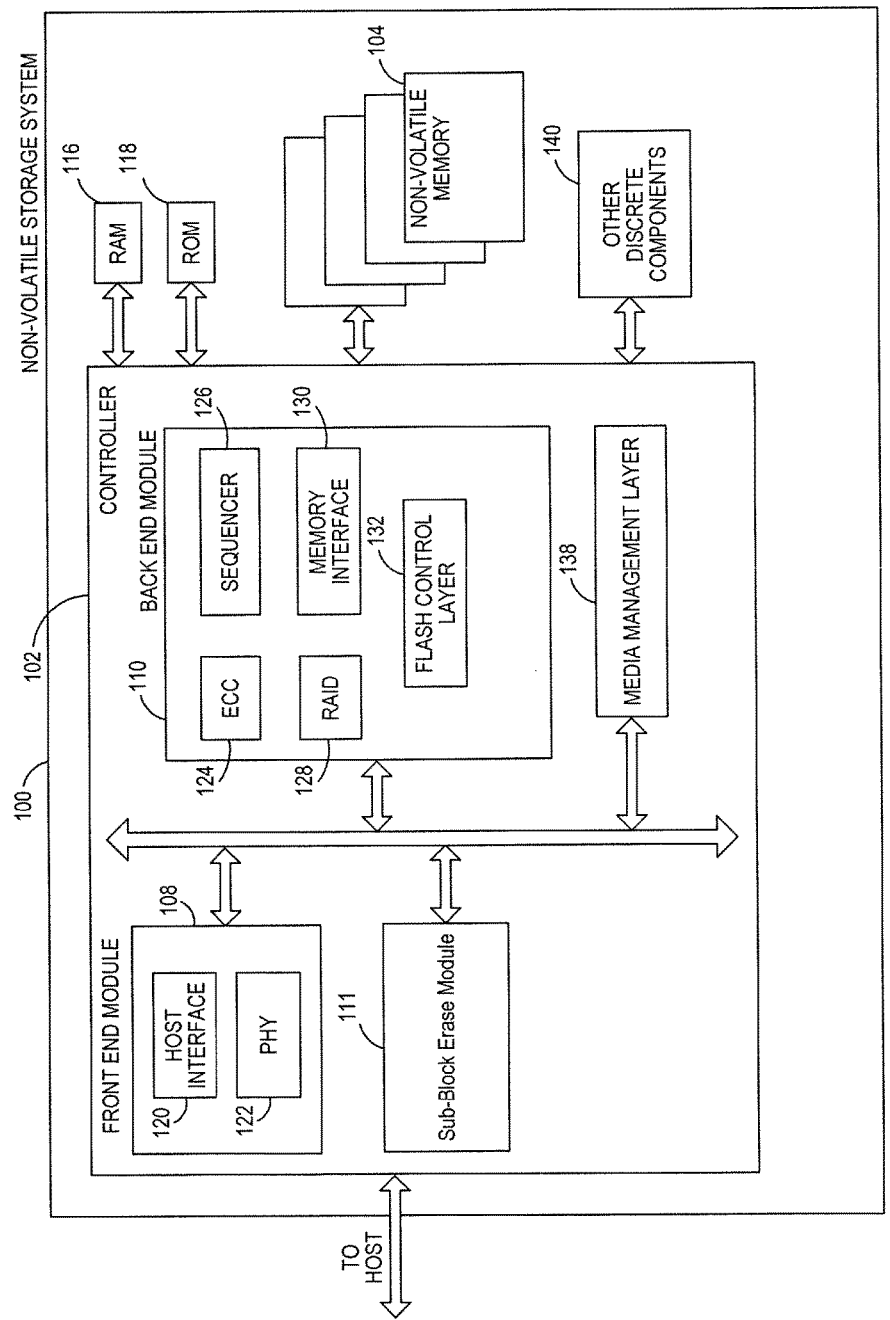
FIG. 2A is a block diagram illustrating exemplary components of the controller of the non-volatile storage system illustrated in FIG. 1A according to an embodiment.

FIG. 2A is a block diagram illustrating exemplary components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. Modules of the controller 102 may include a sub-block erase module 111, which is discussed in more detail below. Implementation of the functionality of these modules will be discussed in more detail below.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, SAS, Fibre Channel, USB, PCIe, and NVMe. The host interface 120 typically facilitates transfer for data, control signals, and timing signals.

Back end module 110 includes an error correction controller (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

The storage system 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
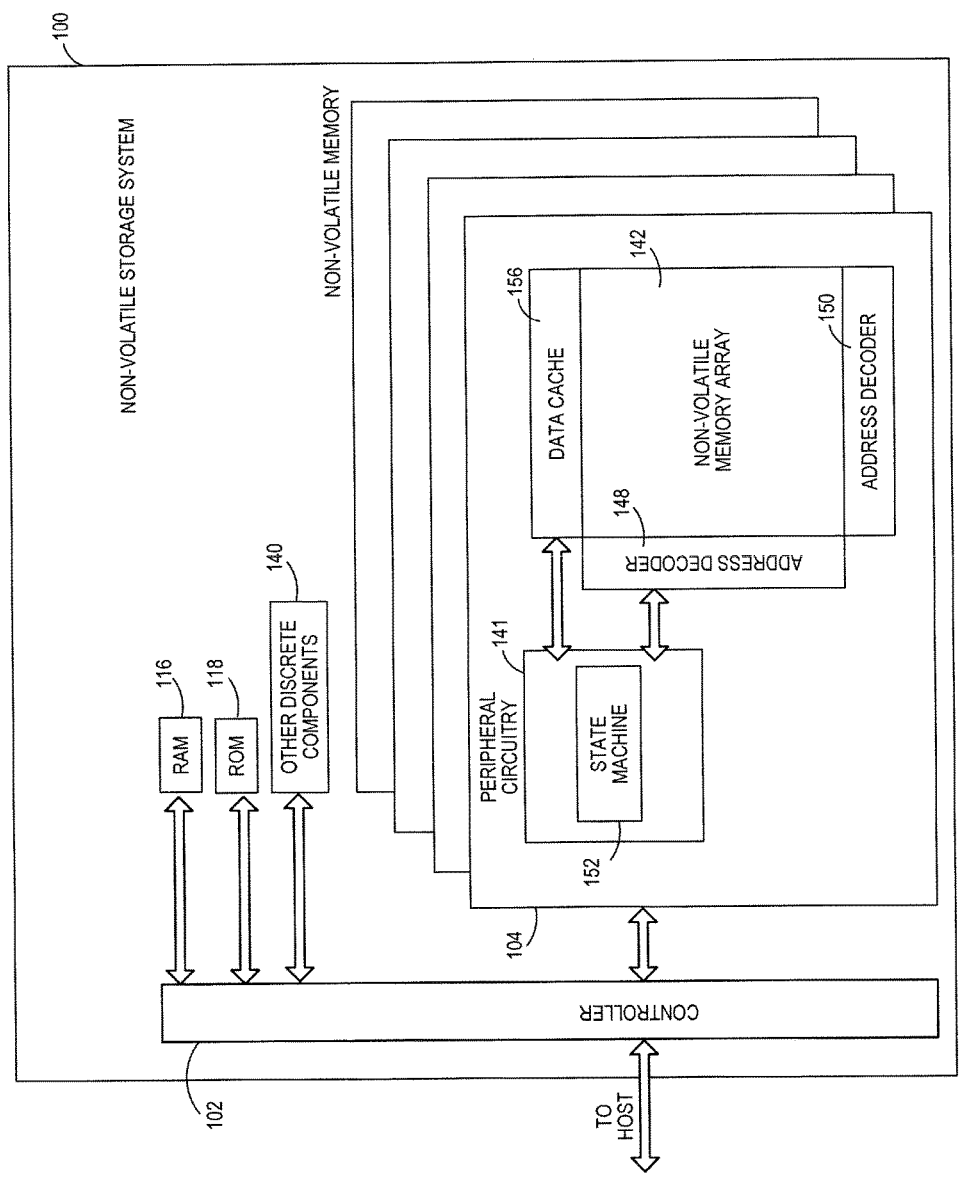
FIG. 2B is a block diagram illustrating exemplary components of the non-volatile memory storage system illustrated in FIG. 1A according to an embodiment.

FIG. 2B is a block diagram illustrating exemplary components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 141 includes a state machine 152 that provides status information to controller 102. Non-volatile memory die 104 further includes a data cache 156 that caches data.

As discussed above, some storage systems contain a memory that is organized into a plurality of memory blocks. Data can be written into part of a block; however, to erase data from part of a block, the entire block is typically erased. In such an operation, data from the block that needs to be preserved is relocated to another block, and then the entire block is erased. The erased block can then be used as a fresh block to store data.

However, as some memory technologies advance, the physical block size increases. For example, with three-dimensional memory, such as Bit Cost Scaling ("BiCS"), the block size has increased across generations from 9 MB (48 word lines×4 strings×3 bits/cell×16 KB page) to 12 MB (64 word lines×4 strings×3 bits/cell×16 KB page) to 18 MB (96 word lines×4 strings×3 bits/cell×16 KB page) to 27 MB (96 word lines×6 strings×3 bits/cell×16 KB page). So, for the same given capacity, we see fewer blocks and larger block sizes as BiCS generations increase.

As block sizes grow larger and become fewer, erasing the entire block using the process mentioned above can be time consuming and can decrease performance. To address this issue, the controller 102 in this embodiment is configured to erase a portion of the block (a "sub-block"). (The controller 102 can also be configured to erase an entire block.) For ease of illustration, the block discussed in the following embodiments has two sub-blocks, and each sub-block has the same size. However, it should be understood that a block can have more than two sub-blocks and that the sub-blocks can all have the same size or at least one sub-block can have a different size from at least one other sub-block. Also, while the memory 104 is described as being a three-dimensional memory in this example, it should be understood that two-dimensional or other memory technologies can be used.

The erase operation of a sub-block is similar to what is described above with respect to an entire block, but only the data from the sub-block (not the entire block) that needs to be preserved is relocated to an area (e.g., a sub-block) of another block. Then, the sub-block (not the entire block) is erased, and the erased sub-block can then be used as a fresh sub-block to store data.

Figure 3:
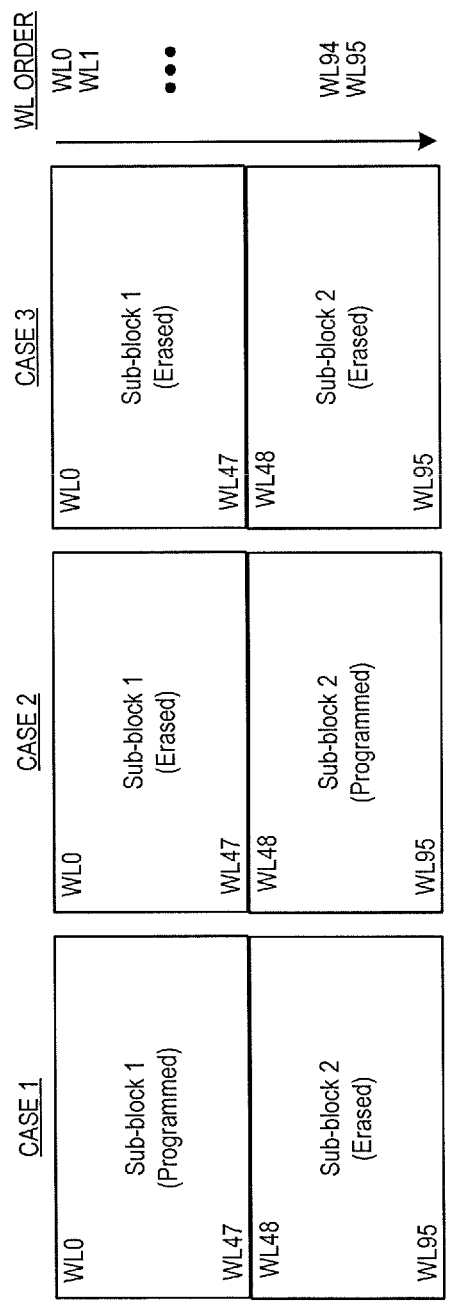
FIG. 3 is an illustration of a plurality of sub-blocks of an embodiment.

One issue that can be encountered when erasing and re-writing a sub-block is that, due to the physical characteristics of how charge is stored in the memory, the erased word lines in a sub-block may be subject to program disturb on a subsequent program due to the existence of an adjacent programmed sub-block. This is illustrated in FIG. 3, which define sub-blocks relative to BiCS 4, which has 96 data word lines. As shown in FIG. 3, sub-block 1 is defined as the first half of the block. In BiCS 4, these are word lines 0 to 47. Sub-block 2 is defined as the second half of the block. In BiCS 4, these are word lines 48 to 95. In this example, the set of word lines in a block are contiguous across the sub-blocks.

FIG. 3 illustrates the three difference cases that can occur for a block after performing an erase to a sub-block. Specifically, in Case 1, sub-block 1 is programmed, and sub-block 2 is erased. (In this example, a programmed sub-block is programmed using multi-level cell (MLC) or triple-level cell (TLC) mode.) In Case 2, sub-block 1 is erased, and sub-block 2 is programmed. In Case 3, sub-blocks 1 and 2 are erased.

Figure 4:
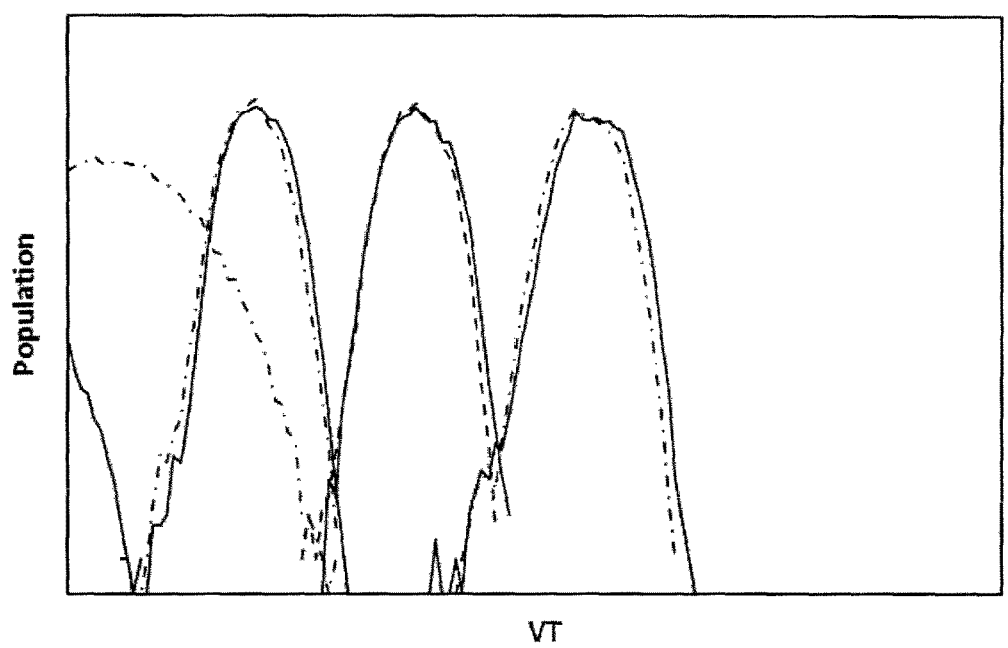
FIG. 4 is a graph of a multi-level cell (MLC) distribution of an embodiment.

In Cases 1 and 3, the block will follow a conventional programming sequence and method; namely, the block will be programmed from WL0→WL95. However, in Case 2, data is erased in sub-block 1, while data is preserved in sub-block 2. If data is later programmed into sub-block 1, there may be poor program disturb (PD) characteristics in sub-block 1, as the memory will show characteristics such high Er→A failures in the Vt distribution, meaning a high bit error rate (BER). FIG. 4 is a graph showing what multi-level cell (MLC) distribution looks like upon programming a word line in sub-block 1, compared to a word line in sub-block 2. In this example, the word line in sub-block 1 would fail ECC criteria.

Figure 5:
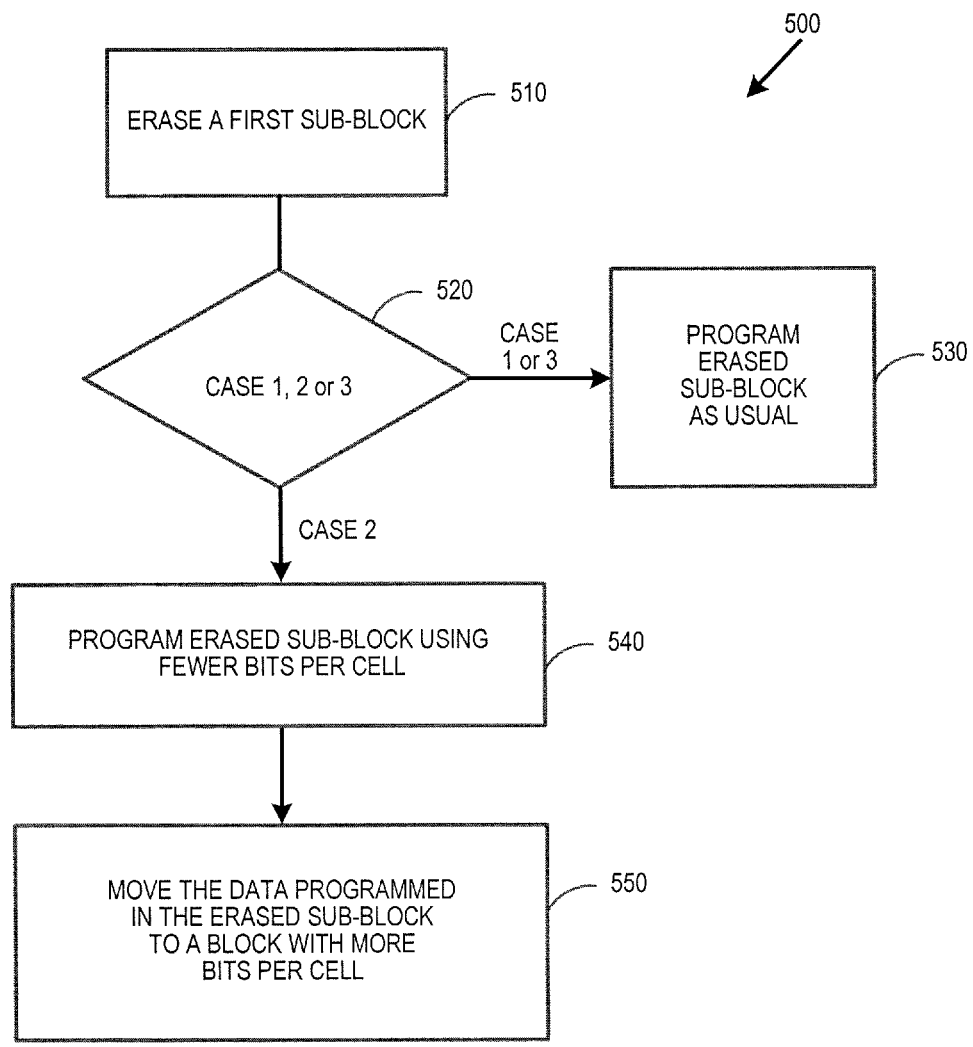
FIG. 5 is a flow chart of a method of an embodiment for using hybrid blocks with sub-block erase operations.

To address this problem, in one embodiment, the controller 102 of the storage device 100 contains a sub-block erase module 111 (see FIG. 2A), which implements a block management method to manage such poor program disturb. FIG. 5 is a flow chart 500 of such a method that can be implemented by the sub-block erase module 111. As noted above, this method can be performed in software or firmware. In this example, each block contains two sub-blocks (sub-block 1 and sub-block 2) and are of the same size. As mentioned above, this is just one example, and other embodiments can use more than one sub-block and/or sub-blocks of different sizes.

As shown in FIG. 5, the controller 102 executes a sub-block erase operation by erasing a first sub-block in the memory 104 (act 510). (It should be noted that the word "first" does not necessarily mean that the first sub-block contains the start of the word line sequence of the block (e.g., sub-block 1).) Next, the controller determines whether Case 1, Case 2, or Case 3 occurs after the first sub-block is erased (act 520). If Case 1 or Case 3 occurs, the erased sub-block is programmed as usual (act 530). However, if Case 2 occurs, the controller 102 programs the erased sub-block using fewer bits per cell than the second sub-block is programmed with (act 540).

Through the use of this method, there will be a larger portion of the memory 104 being used with fewer bits per cell. If the data stored in these sub-blocks is control or management data, it may be preferred to keep this data in a fewer-bits-per-cell memory for data reliability reasons. Otherwise (e.g., if the data is regular user data), the data can later be compacted to higher-bits-per-cell memory that is completely erased. This is shown in act 550 of the flow chart 500, where the controller 102 moves the data programmed in the first sub-block to a completely-erased block having more bits per cell than the first sub-block.

Figure 6:
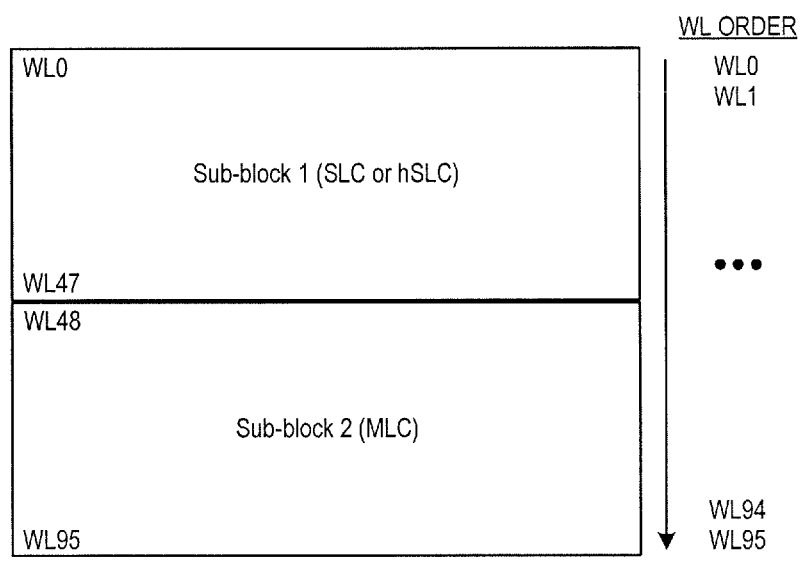
FIG. 6 is an illustration of a plurality of sub-blocks of an embodiment.

FIG. 6 illustrates one embodiment in which the first sub-block (here, sub-block 1) is programmed using a single-level cell (SLC) or high single level cell (hSLC) (i.e., a SLC cell programmed to a higher voltage level) mode, and the second sub-block (here, sub-block 2) is programmed using a multi-level cell (MLC) mode. Of course, many variations are possible. For example, if the second sub-block is programmed using a triple-level cell (TLC) mode, the first sub-block can be programmed using a multi-level cell (MLC), single-level cell (SLC), or high single-level cell (hSLC) mode. As yet another example, if the second sub-block is programmed using a single-level cell (SLC) mode, the first sub-block can be programmed using a high single level cell (hSLC) mode.

Figure 7:
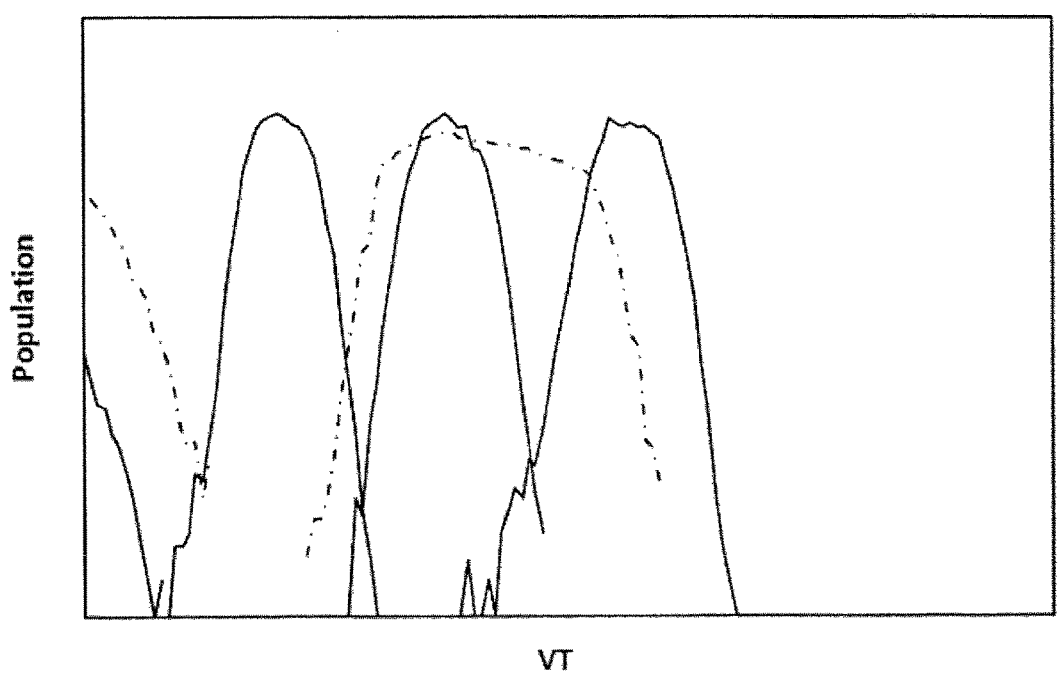
FIG. 7 is a graph of a multi-level cell (MLC) distribution of an embodiment.

By programming fewer bits per cell in sub-block 1 than in sub-block 2, this memory management solution avoids the high bit error rate (BER) that would otherwise occur. For example, as shown in FIG. 7, because SLC and hSLC have better bit error rate (BER) margins, the troubling overlap that occurred in FIG. 4 is not present in FIG. 7. Specifically, in FIG. 7, there is enough of a margin between states, so the bit error rate (BER) is low (if hSLC mode were used, the SLC programmed state would be shifted even higher).

There are several advantages associated with these embodiments. For example, these embodiments can reduce the frequency of block relocation by allowing partial-block erase modes. This reduces the number of program/erase cycles on the blocks, which can improve the endurance of the overall chip. Further, these embodiments allow the storage system 100 to gain better endurance due to fewer block relocations. These embodiments can allow the storage system 100 to utilize word lines that would suffer from poor program disturb characteristics in TLC/MLC and re-designate them as SLC or hSLC for improved bit error rate (BER) margins.

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

What is claimed is:

1. A storage system comprising:
 a memory comprising a block, wherein the block comprises a first sub-block and a second sub-block; and
 a controller in communication with the memory, wherein the controller is configured to:
  erase the first sub-block, wherein the second sub-block is programmed;
  program the first sub-block to fewer bits per cell than the second sub-block is programmed to; and
  move data programmed in the first sub-block to a block having more bits per cell than the first sub-block.

2. The storage system of claim 1, wherein the memory comprises a three-dimensional memory.

3. The storage system of claim 1, wherein the first sub-block is programmed using a single level cell (SLC) mode, and wherein the second sub-block is programmed using a multi-level cell (MLC) mode.

4. The storage system of claim 1, wherein the block comprises at least one additional sub-block.

5. The storage system of claim 1, wherein the first and second sub-blocks are the same size.

6. The storage system of claim 1, wherein the first and second sub-blocks are different sizes.

7. The storage system of claim 1, wherein the block comprises a plurality of word lines, and wherein a programming order of the word lines starts with the word lines in the first sub-block.

8. The storage system of claim 1, wherein the storage system is embedded in a host.

9. The storage system of claim 1, wherein the storage system is removably connected to a host.

10. A method comprising:
 performing the following in a storage system comprising a memory comprising a block:
  erasing a first portion of the block while leaving a second portion of the block with data written in it;
  writing data in the first portion of the block using a write mode that is characterized by a lower bit error rate than a write mode used to write data in the second portion of the block; and
  moving data programmed in the first portion to a block having more bits per cell than the first portion.

11. The method of claim 10, wherein the memory comprises a three-dimensional memory.

12. The method of claim 10, wherein the first portion is programmed using a single level cell (SLC) mode, and wherein the second portion is programmed using a multi-level cell (MLC) mode.

13. The method of claim 10, wherein the block comprises at least one additional portion.

14. The method of claim 10, wherein the first and second portions are the same size.

15. The method of claim 10, wherein the first and second portions are different sizes.

16. The method of claim 10, wherein the block comprises a plurality of word lines, and wherein a programming order of the word lines starts with the word lines in the first portion.

17. The method of claim 10, wherein the storage system is embedded in a host.

18. The method of claim 10, wherein the storage system is removably connected to a host.

19. A storage system comprising:
- a memory comprising a block, wherein the block comprises a first sub-block and a second sub-block;
- means for erasing the first sub-block, wherein the second sub-block is programmed;
- means for programming the first sub-block to fewer bits per cell than the second sub-block is programmed to; and
- means for moving data programmed in the first sub-block to a block having more bits per cell than the first sub-block.

20. The storage system of claim 19, wherein the memory comprises a three-dimensional memory.

21. The storage system of claim 19, wherein the storage system is embedded in a host.

22. The storage system of claim 19, wherein the storage system is removably connected to a host.

* * * * *